(12) United States Patent
Münzer et al.

(10) Patent No.: US 11,652,177 B2
(45) Date of Patent: May 16, 2023

(54) SEMICONDUCTOR DEVICES WITH AN ELECTRICALLY TUNABLE EMITTER AND METHODS FOR TIME-OF-FLIGHT MEASUREMENTS USING AN ELECTRICALLY TUNABLE EMITTER

(71) Applicant: ams AG, Premstaetten (AT)

(72) Inventors: Martin Münzer, Premstaetten (AT); Peter Trattler, Premstaetten (AT)

(73) Assignee: AMS AG, Premstaetten (AT)

( * ) Notice: Subject to any disclaimer, the term of this patent is extended or adjusted under 35 U.S.C. 154(b) by 464 days.

(21) Appl. No.: 16/638,625

(22) PCT Filed: Jul. 27, 2018

(86) PCT No.: PCT/EP2018/070483
§ 371 (c)(1),
(2) Date: Feb. 12, 2020

(87) PCT Pub. No.: WO2019/034395
PCT Pub. Date: Feb. 21, 2019

(65) Prior Publication Data
US 2021/0135023 A1    May 6, 2021

(30) Foreign Application Priority Data
Aug. 17, 2017  (EP) .................................... 17186665

(51) Int. Cl.
*G01S 7/486*      (2020.01)
*H01L 31/0216*    (2014.01)
(Continued)

(52) U.S. Cl.
CPC ...... *H01L 31/02165* (2013.01); *G01S 7/4868* (2013.01); *H01L 31/107* (2013.01); *G01S 7/4865* (2013.01)

(58) Field of Classification Search
CPC .......... G01S 17/02; G01S 17/66; G01S 17/74; G01S 17/86; G01S 17/88; G01S 7/48; H01L 31/021; H01L 31/107
(Continued)

(56) References Cited

U.S. PATENT DOCUMENTS 8,218,149 B2 * 7/2012 Umeda .................. G01S 17/89
356/445
2004/0070768 A1    4/2004  McDaniel et al.
(Continued)

FOREIGN PATENT DOCUMENTS

CN      104521078 A      4/2015
CN      105917357 A      8/2016
(Continued)

OTHER PUBLICATIONS

Chang-Hasnain, C. J.: "Tunable VCSEL" IEEE Journal on Selected Topics in Quantum Electronics, vol. 6, No. 6, Nov./Dec. 2000.
(Continued)

*Primary Examiner* — Que Tan Le
(74) *Attorney, Agent, or Firm* — MH2 Technology Law Group, LLP

(57) ABSTRACT

The semiconductor device comprises an emitter of electromagnetic radiation, a photodetector enabling a detection of electromagnetic radiation of a specific wavelength, a filter having a passband including the specific wavelength, the filter being arranged on the photodetector, the emitter and/or the filter being electrically tunable to the specific wavelength, and a circuit configured to determine a time elapsed between emission and reception of a signal that is emitted by the emitter and then received by the photodetector.

17 Claims, 2 Drawing Sheets

(51) Int. Cl.
*H01L 31/107* (2006.01)
*G01S 7/4865* (2020.01)

(58) Field of Classification Search
USPC .................................... 250/214 R, 226, 221
See application file for complete search history.

(56) References Cited

U.S. PATENT DOCUMENTS

| | | |
|---|---|---|
| 2011/0222064 A1 | 9/2011 | Umeda et al. |
| 2012/0300040 A1 | 11/2012 | McEldowney |
| 2015/0227790 A1 | 8/2015 | Smits |
| 2017/0038459 A1 | 2/2017 | Kubacki et al. |
| 2017/0155225 A1 | 6/2017 | Villeneuve et al. |

FOREIGN PATENT DOCUMENTS

| | | |
|---|---|---|
| CN | 106104297 A | 11/2016 |
| WO | 2012/162326 | 11/2012 |

OTHER PUBLICATIONS

European Patent Office, International Search Report for PCT/EP2018/070483 dated Oct. 9, 2018.
Shang, Zhenghui (Examiner), Chinese Office Action issued in Chinese Application No. 201880048551.1, dated Feb. 24, 2023, with English language translation, 17 pages.

\* cited by examiner

SEMICONDUCTOR DEVICES WITH AN ELECTRICALLY TUNABLE EMITTER AND METHODS FOR TIME-OF-FLIGHT MEASUREMENTS USING AN ELECTRICALLY TUNABLE EMITTER

The present disclosure applies to the field of time-of-flight measurement.

BACKGROUND OF THE INVENTION

Time-of-flight (TOF) cameras or sensors are used to determine the distance of an object by measuring the time elapsed between the emission of a light signal and the reception of the same light signal after its reflection at the object. The arrival of the reflected signal is detected by means of a photodetector, in particular a SPAD (single-photon avalanche diode), and ambient light must be prevented from interfering with this detection. A band-pass filter is conventionally used to shield ambient light from the photodetector. If a vertical-cavity surface-emitting laser (VCSEL) is used as emitter, production tolerances do not allow to define the wavelength within a very small range, and hence the passband of the filter cannot be made as narrow as desired to shield most of the ambient light.

Various types of electrically tunable VCSELs have been developed. An intracavity liquid crystal VCSEL (LC-VCSEL) has a tuning range of up to 75 nm, depending on the thickness of the liquid crystal, and can be continuously tuned by application of a voltage. Such a VCSEL comprises an active region between an anode layer and a cathode layer on one side of the anode layer, and a liquid crystal layer between the anode layer and a further cathode layer on the opposite side of the anode layer. An LC-VCSEL has the advantage that it is purely electrically tuned and hence immune to vibrations.

An MEMS-VCSEL with a microelectromechanical system (MEMS) is also electrically tunable. The longitudinal extension of the resonant cavity is confined by a fixed bottom mirror and a movably suspended top mirror. An electrostatic actuator comprising capacitor plates in fixed spatial relations to the positions of the mirrors is used to control the length of the resonant cavity. When the capacitor plates are charged to generate an electrostatic force, the distance between the mirrors is decreased and the resonant wavelength becomes shorter. By driving the actuator with specially shaped voltage waveforms, the laser wavelength can be swept in time.

A cantilever VCSEL (c-VCSEL) is a further example of an electrically tunable VCSEL. It comprises a substrate carrying a bottom n-DBR (distributed Bragg reflector), a resonant cavity with an active region, and a top mirror, which comprises a p-DBR, an airgap and a top n-DBR, which is freely suspended above the resonant cavity and supported by means of a cantilever structure. Laser drive current is injected via the p-DBR. An oxide aperture above the resonant cavity provides efficient current guiding and optical index guiding. A top tuning contact is arranged on the top n-DBR. Types of cantilever VCSELs may comprise a cantilever bank with different lengths of the cantilever or different geometric forms of the VCSEL and the cantilever.

Further types of tunable VCSELs are multi-mesa VCSELs with different aperture diameters, multi-mesa VCSELs with layers providing resonant cavities of different lengths for the generation of radiation of different wavelengths, arrays of multi-mesa VCSELs emitting different wavelengths, and high-contrast grating VCSELs (HCG-VCSELs).

SUMMARY OF THE INVENTION

The definitions as described above also apply to the following description unless stated otherwise.

The semiconductor device comprises an emitter of electromagnetic radiation, a photodetector enabling a detection of electromagnetic radiation of a specific wavelength, a filter having a passband including the specific wavelength, the filter being arranged on the photodetector, the emitter and/or the filter being electrically tunable to the specific wavelength, and a circuit configured to determine a time elapsed between emission and reception of a signal that is emitted by the emitter and then received by the photodetector. The passband can be selected to be narrow, especially narrower than 5 nm, in order to shield as much ambient light as possible. The range of 5 nm means that the largest wavelength of the passband is 5 nm larger than the shortest wavelength of the passband.

In an embodiment of the semiconductor device, the photodetector comprises at least one single-photon avalanche diode (SPAD).

In a further embodiment of the semiconductor device, the emitter is configured to emit a signal of limited temporal duration for a time-of-flight measurement.

In a further embodiment of the semiconductor device, the emitter is an electrically tunable vertical-cavity surface-emitting laser.

A further embodiment of the semiconductor device comprises a photodetector device including the photodetector, a carrier, the photodetector device and the emitter being mounted on the carrier, a cover with windows forming apertures for the photodetector and the emitter, and electric connections between the photodetector device and the emitter.

A further embodiment of the semiconductor device comprises a reference photodetector arranged to monitor electromagnetic radiation from the emitter, and a further filter having a passband including the specific wavelength, the further filter being arranged on the reference photodetector, between the carrier and the cover. The reference photodetector with the further filter can especially be arranged between the carrier and the cover.

In one aspect, the method for time-of-flight measurements comprises using an electrically tunable emitter for the generation of a signal of electromagnetic radiation, the temporal duration of the signal being restricted for a time-of-flight measurement, and tuning the generation of the signal to a specific wavelength. The signal is emitted, a received signal resulting from a reflection of the emitted signal is detected through a filter with a passband including the specific wavelength, and the time elapsed between the emission and the reception of the signal is determined. The passband can be selected to be narrow, especially narrower than 5 nm, in order to shield as much ambient light as possible.

An electric signal can be used to tune the generation of the signal. The electric signal may especially be a tuning voltage applied to an electrically tunable vertical-cavity surface-emitting laser, which is used as emitter.

In a variant of the method, the generation of the signal is continually tuned over a range of tuning conditions, the tuning condition that produces a maximal strength of the received signal is determined, and the generation of the signal is tuned to the specific wavelength by applying the determined tuning condition.

In a further variant of the method, the electromagnetic radiation from the electrically tunable emitter is monitored by a reference photodetector with a further filter having a passband including the specific wavelength.

In a further variant of the method, the received signal is detected with a photodetector provided with the filter in such a manner that the field of view of the photodetector depends on the wavelength of incident radiation. The generation of the signal is additionally tuned to at least one further specific wavelength that is different from the specific wavelength, thus performing measurements for different fields of view.

In a further aspect, the method for time-of-flight measurements comprises using an emitter for an emission of a signal of electromagnetic radiation, a temporal duration of the signal being restricted for a time-of-flight measurement, detecting a received signal through an electrically tunable filter with a passband including a specific wavelength, the received signal resulting from a reflection of the emitted signal, tuning the filter to the specific wavelength, and determining a time elapsed between the emission and the reception of the signal.

BRIEF DESCRIPTION OF THE DRAWINGS

The following is a detailed description of examples of the semiconductor device and the method in conjunction with the appended figures.

DETAILED DESCRIPTION

Figure 1:
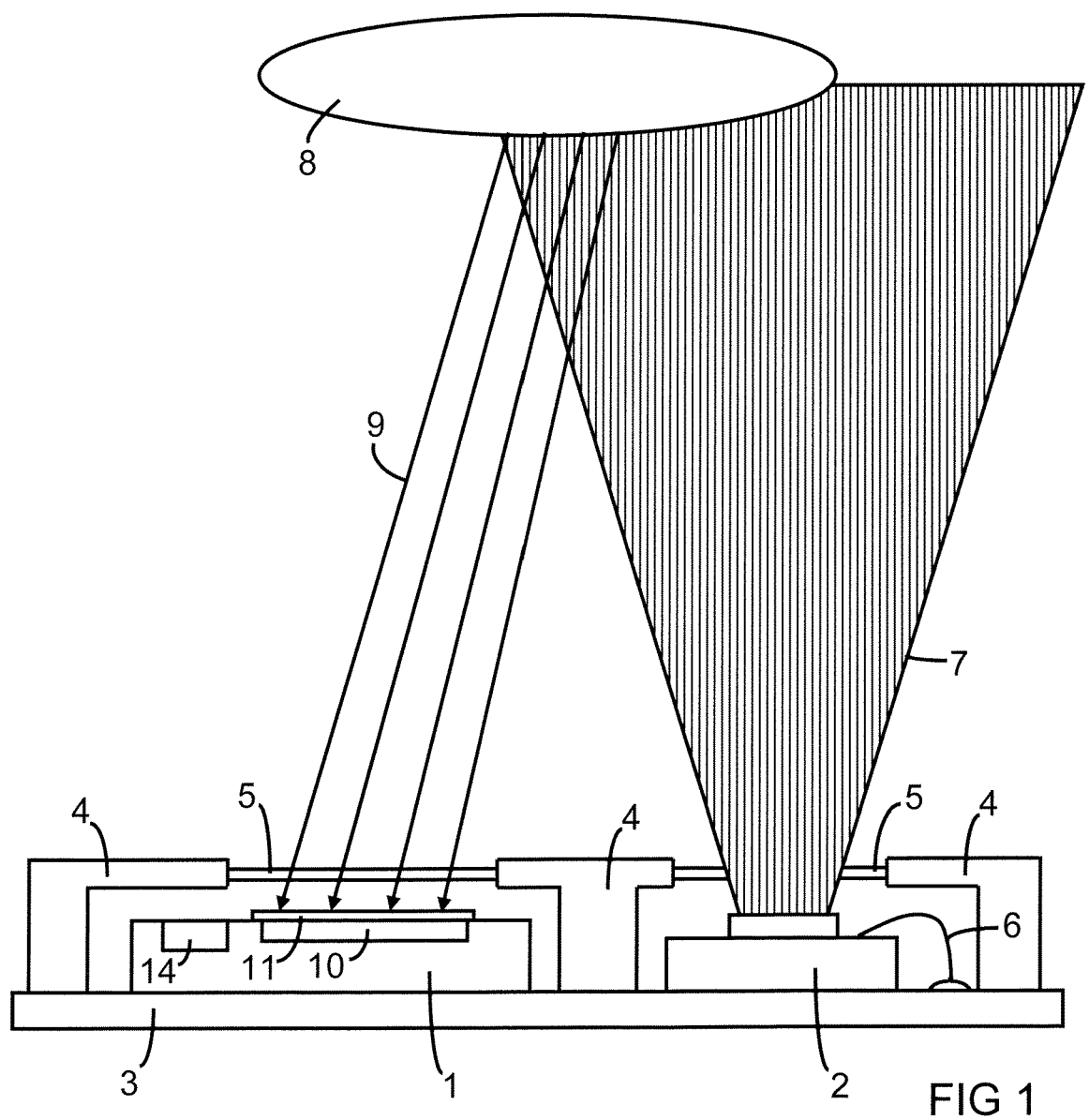
FIG. 1 shows a semiconductor device including an electrically tunable emitter and a photodetector.

FIG. 1 shows an arrangement of the semiconductor device for TOF measurements in a cross section. The semiconductor device comprises a photodetector device 1 including a photodetector 10 and a filter 11, and an electrically tunable emitter 2, which may especially be an electrically tunable vertical-cavity surface-emitting laser. The photodetector device 1 and the electrically tunable emitter 2 are arranged in such a manner that radiation emitted by the electrically tunable emitter 2 and reflected by an external reflecting object 8 can be received and detected by the photodetector 10. The photodetector device 1 may be any semiconductor photodetector device and may especially comprise a photodiode or an array of photodiodes, for instance. The photodetector may comprise a single-photon avalanche diode or an array of single-photon avalanche diodes, for instance.

Components of a circuit 14 for processing and/or evaluation of a measurement can be integrated in the photodetector device 1, in the electrically tunable emitter 2 or both in the photodetector device 1 and in the electrically tunable emitter 2. Components of the circuit 14 may instead or additionally be provided by a further semiconductor chip, especially an ASIC chip, or by components that are arranged outside the device shown in FIG. 1.

The photodetector device 1 and the electrically tunable emitter 2 can especially be mounted on a carrier 3, which may be a printed circuit board including a wiring, for instance. A cover 4 with windows 5 above the photodetector 10 and the electrically tunable emitter 2 may be applied to form cavities accommodating the photodetector device 1 and the electrically tunable emitter 2. The cover 4 may comprise an opaque material to shield ambient light.

Electric connections, which are only schematically indicated in FIG. 1 by a bond wire 6, are provided to connect the photodetector device 1 and the electrically tunable emitter 2 with one another and optionally with external terminals. The circuit 14 is configured to allow the electrically tunable emitter 2 to be tuned to the desired wavelength or wavelength range, according to the passband of the filter 11.

FIG. 1 indicates a lobe or a solid angle of emission 7 from the electrically tunable emitter 2. A reflecting object 8 is schematically indicated. Some reflected beams 9 are incident on the photodetector 10 through the filter 11 and are detected by the photodetector 10. A modulation of the emitted radiation provides a signal of relatively short duration. The time-of-flight of the signal is determined by monitoring the time of emission of the signal and the time of reception of the reflected signal.

In further embodiments, the filter 11 is tuned instead of or additionally to the emitter 2. If the filter 11 is tuned, the emitter 2 may be operated at a fixed wavelength.

Figure 2:
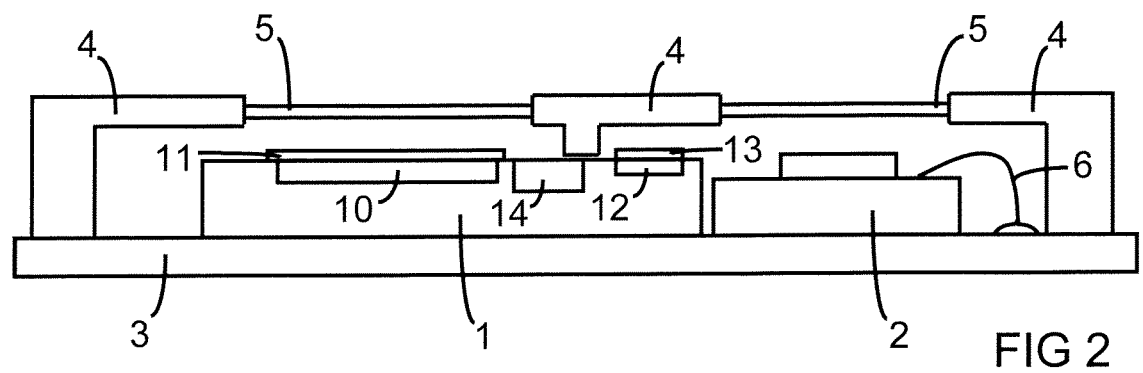
FIG. 2 shows a further semiconductor device including an electrically tunable emitter and a photodetector.

FIG. 2 is a cross section of a further embodiment of the semiconductor device. Elements of the semiconductor device according to FIG. 2 that correspond to elements of the semiconductor device according to FIG. 1 are designated with the same reference numerals. The semiconductor device according to FIG. 2 comprises a reference photodetector 12 covered with a further filter 13 in the photodetector device 1. The reference photodetector 12 is provided to facilitate the tuning of the electrically tunable emitter 2 and/or the filter 11.

The wavelength of the radiation emitted by the electrically tunable emitter 2 is tuned to the passband of the filter 11.

Therefore a filter of extremely narrow passband (typically 5 nm) can be used for rejecting almost all ambient light. The emitted wavelength can be adapted to a central wavelength in the passband of the filter 11, for instance. This can especially be achieved by applying a variable tuning voltage to the electrically tunable emitter 2, which may especially be an electrically tunable vertical-cavity surface-emitting laser. The tuning voltage can be continuously swept through a prescribed range, for instance. A portion of the emitted radiation is detected by the photodetector 10 or the reference photodetector 12 in order to control the tuning process.

Figure 3:
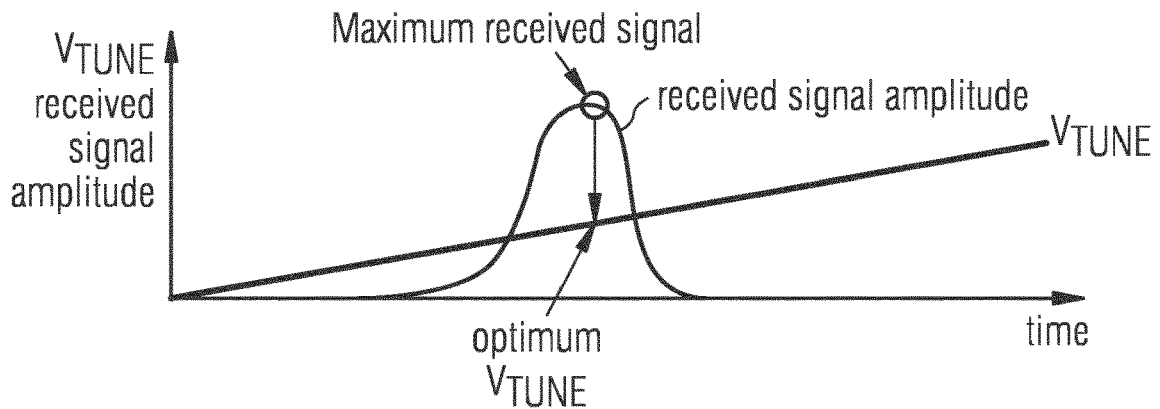
FIG. 3 is a diagram for the sweep of a tuning voltage and the corresponding amplitude of the received signal.

FIG. 3 is a diagram for the sweep of a tuning voltage $V_{TUNE}$ and the corresponding amplitude of the received signal. In this example the tuning voltage $V_{TUNE}$ is continuously swept from a minimal value to a maximal value. A determination of the actual wavelength is not required. Instead, the maximum of the received signal amplitude indicates the optimum tuning voltage $V_{TUNE}$, which yields the wavelength that is optimally adapted to the passband of the filter 11. The lower stopband of the filter 11 may typically range from 350 nm to 935 nm, the passband from 940 nm to 945 nm, and the upper stopband from 950 nm to 1100 nm. A change of the central frequency of the filter 11 is not required.

Instead of a linear sweep as described above, the following methods can be appropriate to find a suitable $V_{TUNE}$ in shorter time. A coarse sweep may be performed to find a restricted region of preference for the tuning voltage $V_{TUNE}$, and then a fine sweep is performed in the restricted region.

Once an optimal $V_{TUNE}$ is found, it may suffice to check from time to time whether a slight change of the tuning voltage $V_{TUNE}$ will yield a better result. This provides an easy way to compensate for a drift of the wavelength emitted by the electrically tunable emitter 2, which may occur when the temperature changes during operation, for instance. In embodiments comprising a reference photodetector 12, the photodetector 10 can be employed for normal operation of the semiconductor device, and the reference photodetector 12 can simultaneously be employed to check the tuning voltage $V_{TUNE}$.

Figure 4:
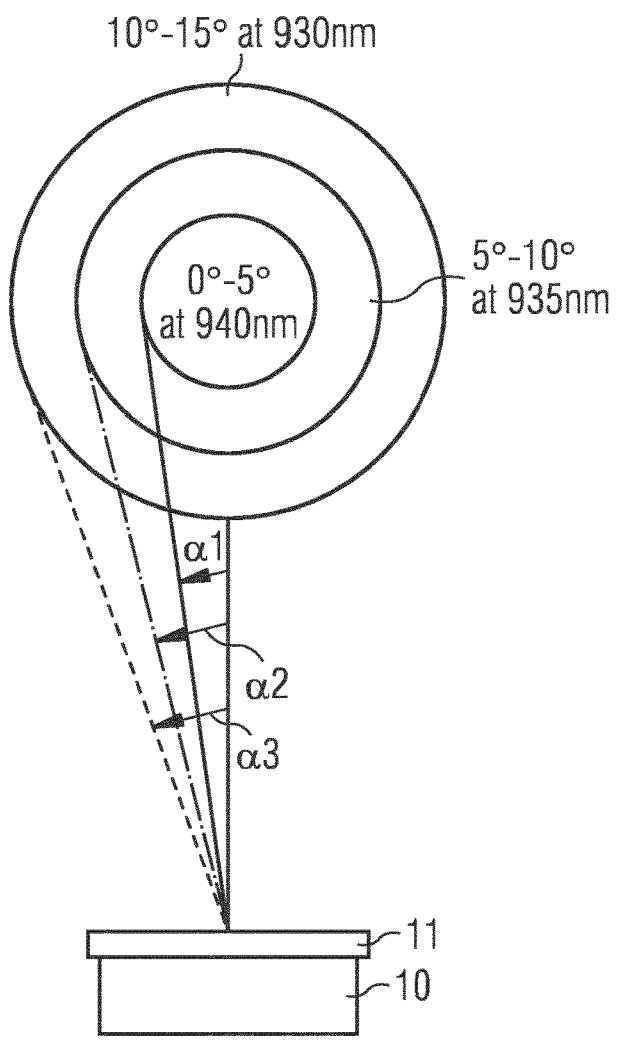
FIG. 4 depicts the dependence of the field of view of the photodetector on the wavelength of the radiation.

FIG. 4 depicts the dependence of the field of view of the photodetector on the wavelength of the radiation. If the central wavelength of the filter 11 is 940 nm, for example, and the electrically tunable emitter 2 is tuned to 940 nm, the field of view of the photodetector 10 may typically be defined by the solid angle whose half aperture is 5°, indicated in FIG. 4 by the first angle α1 of half aperture. If the tuning voltage $V_{TUNE}$ is suitably changed, the field of view of the photodetector 10 shifts to the region between the first angle α1 of half aperture and a second angle α2 of half aperture, which may typically be 10°. This may occur if the electrically tunable emitter 2 is tuned to 935 nm, for instance. The field of view of the photodetector 10 may instead shift to the region between the second angle α2 of half aperture and a third angle α3 of half aperture, which may typically be 15°. This may occur if the electrically tunable emitter 2 is tuned to 930 nm, for instance. Thus images of different portions of an object can be detected by just varying the tuning voltage $V_{TUNE}$. These images can be stored and then combined to a complete image of the object. In this fashion a selective field of view is implemented in the semiconductor device without adding any other optical device.

Proximity or gesture detection and mobile phones are among the many applications for which the described semiconductor device and method are advantageous.

The invention claimed is:

1. A semiconductor device, comprising:
an emitter of electromagnetic radiation, wherein the emitter is configured to operate at a tuning voltage that can be continuously swept through a prescribed range;
a photodetector enabling detection of electromagnetic radiation of a specific wavelength;
a filter having a first passband including the specific wavelength, wherein the filter is arranged on the photodetector, and wherein the emitter is electrically tunable to the specific wavelength, the filter is electrically tunable to the specific wavelength, or the emitter and the filter are electrically tunable to the specific wavelength; and
a circuit configured to determine a time elapsed between emission and reception of a signal that is emitted by the emitter and then received by the photodetector;
wherein determination of a maximum of a received signal amplitude indicates an optimal tuning voltage yielding a wavelength that is optimally adapted to the first passband.

2. The semiconductor device of claim 1, wherein the emitter is electrically tunable to the specific wavelength.

3. The semiconductor device of claim 1, wherein the filter is electrically tunable to the specific wavelength.

4. The semiconductor device of claim 1, wherein the photodetector comprises at least one single-photon avalanche diode.

5. The semiconductor device of claim 1, wherein the first passband is narrower than 5 nanometers (nm).

6. The semiconductor device of claim 1, wherein the emitter is configured to emit a signal of limited temporal duration for a time-of-flight measurement.

7. The semiconductor device of claim 1, wherein the emitter is an electrically tunable vertical-cavity surface-emitting laser.

8. The semiconductor device of claim 1, further comprising:
a reference photodetector arranged to monitor the electromagnetic radiation emitted from the emitter; and
a further filter having a second passband including the specific wavelength, wherein the further filter is arranged on the reference photodetector.

9. The semiconductor device of claim 1, further comprising:
a photodetector device including the photodetector;
a carrier, wherein the photodetector device and the emitter are mounted on the carrier;
a cover with windows forming apertures for the photodetector and the emitter; and
electric connections between the photodetector device and the emitter.

10. The semiconductor device of claim 9, further comprising:
a reference photodetector arranged between the carrier and the cover to monitor the electromagnetic radiation emitted from the emitter; and
a further filter having a second passband including the specific wavelength, wherein the further filter is arranged on the reference photodetector between the carrier and the cover.

11. A method for time-of-flight measurements, the method comprising:
using an electrically tunable emitter for generation of a signal of electromagnetic radiation, wherein a temporal duration of the signal is restricted for a time-of-flight measurement;
continually tuning the generation of the signal over a range of tuning conditions;
determining the tuning condition that produces a maximal strength of a received signal;
tuning the generation of the signal to a specific wavelength by applying the determined tuning condition;
emitting the signal;
detecting the received signal through a filter with a first passband including the specific wavelength, wherein the received signal results from a reflection of the emitted signal; and
determining a time elapsed between the emission and the reception of the signal.

12. The method of claim 11, wherein the first passband is narrower than 5 nanometers (nm).

13. The method of claim 11, wherein an electric signal is used to tune the generation of the signal.

14. The method of claim 13, wherein an electrically tunable vertical-cavity surface-emitting laser is used as the electrically tunable emitter, and wherein the electric signal is a tuning voltage applied to the electrically tunable vertical-cavity surface-emitting laser.

15. The method of claim 11, further comprising:
monitoring the electromagnetic radiation emitted from the electrically tunable emitter by a reference photodetector with a further filter having a second passband including the specific wavelength.

16. The method of claim 11, further comprising:
- detecting the received signal with a photodetector provided with the filter in such a manner that a field of view of the photodetector depends on a wavelength of incident radiation; and
- tuning the generation of the signal additionally to at least one further specific wavelength that is different from the specific wavelength, thus performing measurements for different fields of view.

17. A method for time-of-flight measurements, the method comprising:
- using an emitter for emission of a signal of electromagnetic radiation, wherein a temporal duration of the signal is restricted for a time-of-flight measurement;
- continually tuning a generation of the signal over a range of tuning conditions;
- determining the tuning condition that produces a maximal strength of a received signal;
- tuning the generation of the signal to a specific wavelength by applying the determined tuning condition;
- detecting the received signal through an electrically tunable filter with a passband including the specific wavelength, wherein the received signal results from a reflection of the emitted signal;
- tuning the filter to the specific wavelength; and
- determining a time elapsed between the emission and the reception of the signal.

\* \* \* \* \*